(12) United States Patent
Garghetti et al.

(10) Patent No.: US 10,944,410 B1
(45) Date of Patent: Mar. 9, 2021

(54) INJECTION CIRCUIT SYSTEM AND METHOD

(71) Applicant: Infineon Technologies AG, Neubiberg (DE)

(72) Inventors: Alessandro Garghetti, Villach (AT); Luigi Grimaldi, Villach (AT); Matteo Bassi, Villach (AT); Dmytro Cherniak, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/806,500

(22) Filed: Mar. 2, 2020

(51) Int. Cl.
*H03L 7/099* (2006.01)
*H03L 7/18* (2006.01)
*H03L 7/093* (2006.01)

(52) U.S. Cl.
CPC ............ *H03L 7/0995* (2013.01); *H03L 7/093* (2013.01); *H03L 7/18* (2013.01)

(58) Field of Classification Search
CPC ..... H03L 7/093; H03L 7/0995; H03L 7/0996; H03L 7/0997; H03L 7/0998; H03L 7/16; H03L 7/18
USPC .................................................. 327/156–158
See application file for complete search history.

(56) References Cited

U.S. PATENT DOCUMENTS 5,576,647 A * 11/1996 Sutardja ............... H03K 3/0231
327/108

OTHER PUBLICATIONS

Betancourt-Zamora, Rafael J., "CMOS Injection-locked Ring Oscillator Frequency Dividers", Stanford Microwave Integrated Circuits Laboratory, http://www-smirc.stanford.edu/, Mar. 29, 2001, 40 pages.
Lee, Dong-Soo et al., "A Wide-Locking-Range Dual Injection-Locked Frequency Dividers with an Automatic Frequency Calibration Loop in 65-nm CMOS", IEEE Transactions on Circuits and Systems—II: Express Briefs, vol. 62, No. 4, Apr. 2015, 5 pages.
Liu, Supeng et al., "Ring Oscillator Based Injection Locked Frequency Dividers Using Dual Injection Paths", IEEE Microwave and Wireless Communications Letters, vol. 25, No. 5, May 2015, 3 pages.
Melville, R., et al., "An injection locking scheme for precision quadrature generation", IEEE Proceedings of the 27th European Solid-State Circuits Conference, Sep. 18-20, 2001, 20 pages.
Yi, Xiang et al., "Design of Ring-Oscillator-Based Injection-Locked Frequency Dividers with Single-Phase Inputs", IEEE Microwave and Wireless Components Letters, vol. 21, No. 10, Oct. 2011, 3 pages.

(Continued)

*Primary Examiner* — Diana J. Cheng
(74) *Attorney, Agent, or Firm* — Slater Matsil, LLP (57) ABSTRACT

In accordance with an embodiment, a ring oscillator includes a plurality of stages coupled in a ring configuration, where stage of the plurality of stages has an input node coupled to an output node of a previous stage of the plurality of stages. Each stage of the plurality of stages includes: a ring oscillator transistor having a control node coupled to the input node, and a load path coupled to the output node; a direct injection circuit having a load path coupled between the control node of the ring oscillator transistor and the output node, and a control node coupled to a first oscillator input node; and a tail injection circuit having a load path coupled between the output node and a first power supply node, and a control node coupled to a second oscillator input node.

20 Claims, 8 Drawing Sheets

(56) References Cited

OTHER PUBLICATIONS

Yu, X.P., et al, "0.8 mW 1.1-5.6 GHz dual-modulus prescaler based on multi-phase quasi-differential locking divider", Electronics Letters, vol. 26, No. 24, Nov. 25, 2010; 2 pages.

Yu, Xiaopeng et al., "Sub-mW Multi-GHz CMOS Dual-Modulus Prescalers Based on Programmable Injection-Locked Frequency Dividers", RTU1D-3, IEEE Radio Frequency Integrated Circuits Symposium, Jun. 15-17, 2008, 4 pages.

\* cited by examiner

INJECTION CIRCUIT SYSTEM AND METHOD

TECHNICAL FIELD

The present invention relates generally to an injection circuit system and method.

BACKGROUND

Phase locked loop (PLL) circuits are frequently used in radio frequency (RF) systems to generate high frequency signals that are either directly transmitted in the case of radar systems, or used to modulate transmitted RF signals and demodulate received RF signals in the case of RF communication systems. Basically, the PLL circuit is a feedback loop that controls the frequency of a high frequency oscillator, such as voltage-controlled oscillator (VCO), by comparing the phase of a lower frequency reference signal with a frequency divided output of the high frequency oscillator. For example, 10 MHz crystal oscillator could be used to control the frequency of a 1 GHz VCO by dividing the frequency of the 1 GHz VCO by 100 and comparing the 10 MHz crystal oscillator signal with the divided VCO signal using a phase detector circuit.

The circuits used to divide the frequency of the VCO typically include a prescaler followed by a programmable divider. The design of the prescaler is particularly challenging because at least a portion of the prescaler operates at the same frequency as the VCO. Many systems use current mode logic (CML) prescalers; however, CML based prescalers are prone to high power consumption, which increases with frequency. A lower power option for the prescaler is an injection locked frequency divider (ILFD); however, one issue with using ILFD based prescalers (also referred to as an injection locked prescaler) is a decreased frequency operating range compared to CML based prescalers.

SUMMARY

In accordance with an embodiment, a ring oscillator includes a plurality of stages coupled in a ring configuration, where stage of the plurality of stages has an input node coupled to an output node of a previous stage of the plurality of stages. Each stage of the plurality of stages includes: a ring oscillator transistor having a control node coupled to the input node, and a load path coupled to the output node; a direct injection circuit having a load path coupled between the control node of the ring oscillator transistor and the output node, and a control node coupled to a first oscillator input node; and a tail injection circuit having a load path coupled between the output node and a first power supply node, and a control node coupled to a second oscillator input node.

In accordance with another embodiment, a method of operating a circuit comprising an injection locked frequency divider (ILFD) having a plurality of stages coupled in a ring configuration includes: injecting an oscillator signal in each stage of the plurality of stages using a respective direct injection circuit coupled between an input node and an output node of each stage of the plurality of stages; and injecting the oscillator signal at an output node of each stage of the plurality of stages using a respective tail injection circuit coupled between a first power supply node and the output node of each stage of the plurality of stages.

In accordance with a further embodiment, a phase locked loop includes: an injection locked prescaler comprising a ring oscillator, wherein each respective stage of the ring oscillator comprises a respective direct injection circuit coupled between an input and output of each respective stage, and a tail injection circuit coupled between the output of each respective stage and a power supply node; a phase detector having an input coupled to an output of at least one stage of the ring oscillator; and a voltage controlled oscillator having a oscillator signal output coupled to each respective direct injection circuit and each respective tail injection circuit, and a frequency control input coupled to an output of the phase detector.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for a prescaler for use in a phase-locked loop that is implemented using an injection-locked frequency divider (ILFD). The invention, however, can be applied to injection locked oscillators for use in other applications.

In an embodiment of the present invention, a ring oscillator includes a plurality of stages arranged in a ring configuration. In addition to the circuits that comprise the ring oscillator, additional devices are used to provide an injection signal path into the ring oscillator. For example, in some embodiments, each stage of the ring oscillator includes a direct injection circuit coupled between input and output of each stage, and a tail injection circuit coupled to the output of each stage. By using multiple injection paths for each stage of the ring oscillator, the locking range of the ring oscillator can be increased. Accordingly, embodiments of the present invention provide a way of implementing a prescaler circuit that has a small chip area, low power consumption and a wide locking range. For example, some embodiment ILFD circuits have a power consumption that is less than 10 mW and a locking range of at least 30%.

Figure 1:
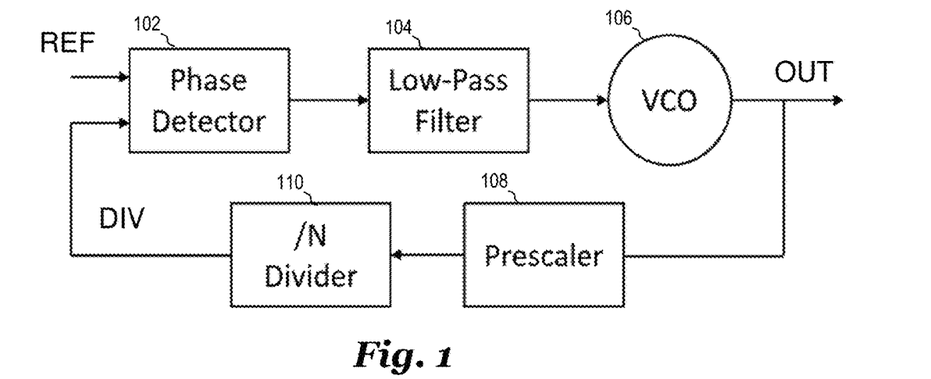
FIG. 1 is a block diagram an embodiment PLL.

FIG. 1 illustrates a block diagram of a PLL circuit 100 that includes phase detector 102, low-pass filter 104, VCO 106, prescaler 108 and divide-by-N counter 110. In embodiments of the present invention, the PLL circuit 100 may be used to provide a VCO signal at node OUT having a higher frequency than the reference clock signal at node REF. During operation, phase detector 102 compares a phase of the reference clock signal at node REF with a divided oscillator signal at node DIV and provides a phase detection signal to a frequency control in input of VCO 106. If the phase of the reference clock signal at node REF leads the phase of the divider oscillator signal at node DIV, the output signal (also referred to as a "phase detection signal") of the phase detector 102 is increased, which causes a corresponding increase of the frequency of VCO 106. The input to the VCO can be referred to a "VCO control signal" or a "frequency control input." On the other hand, if the phase of the reference clock signal at node REF lags the phase of the divider oscillator signal at node DIV, the output signal of the phase detector 102 is decreased, which results in corresponding decrease in the frequency of VCO 106. Phase detector 102 may be implemented using phase detector circuits and/or phase-frequency detector circuits known in the art. One commonly used phase-frequency detector circuit includes one or more digital latch circuits followed by a charge pump. In such a circuit, the charge pump is configured to provide a current of a first polarity during the period of time between when the reference clock signal is asserted when the divides oscillator signal is asserted (when the reference clock signal at node REF leads the divided clock signal at node DIV), and is configured to provide a current of a second polarity opposite the first polarity during the during the period of time between when the divided oscillator signal is asserted and when the reference clock signal is asserted (when the reference clock signal at node REF lags the divided clock signal at node DIV).

In some embodiments, the current pulses provided by the charge pump of phase detector 102 are filtered by low-pass filter 104, which can also be referred to as a loop filter. Low pass filter 104 may be implemented using any suitable low pass filter circuit known in the art. For example, low pass filter 104 may be implemented using at least one capacitor to filter the current pulses. The low pass filter 104 may also include additional components, such an additional capacitor and one or more resistors used to shape the loop dynamics of the PLL. In some embodiments, an active loop filter may be used.

VCO 106, which is used to generate an RF oscillator signal at an oscillator signal output, may be implemented using any suitable RF VCO signal known in the art. For example, in some embodiments VCO 106 may be implemented using a Colpitts or a negative resistance oscillator that includes an LC tank circuit. In some embodiments, VCO 106 is configured to oscillate at frequencies of about 30 GHz and higher, although lower frequencies are also possible.

Prescaler 108 is configured to divide the frequency of the RF oscillator signal to a lower frequency. For example, in some embodiments prescaler 108 is implemented as an ILFD that is configured to divide by a factor of five or seven, although other division ratios may be implemented. In some embodiments, prescaler 108 may have a programmable division ratio and may be operated as a dual modulus prescaler. The circuit implementation of prescaler 108 is further described with respective to embodiments disclosed herein.

Divide-by-N counter 110 is configured to provide a further division of the divided RF oscillator signal provided by prescaler 108, and may be implemented using divider circuits known in the art. In one example, divide-by-N counter 110 is implemented using a counter such that the frequency at the input of divide-by-N counter 110 is an integer multiple of the output of divide-by-N counter 110. In some embodiments, divide-by-N counter 110 may be implemented using a pulse-swallowing counter, a dual modulus counter, or a combination thereof to form a fractional N counter. In some embodiments, the division ratio of divide-by-N counter 110 is programmable.

In various embodiments, all of or a portion of PLL 100 may be implemented as an integrated circuit disposed on a signal semiconductor substrate, such as a silicon substrate. In other embodiments, the various components of PLL 100 may be partitioned over a plurality of integrated circuits and passive components. In one particular embodiment, phase detector 102, VCO 106, prescaler 108 and divide-by-N counter is implemented on an integrated circuit, while at least a portion of the low pass filter 104 is implemented using external components, such as one more external capacitor. In some embodiments, the components comprised by PLL 100 are disposed on a printed circuit board (PCB). PLL 100 may also be integrated along with other components of an RF system.

Figure 2A:
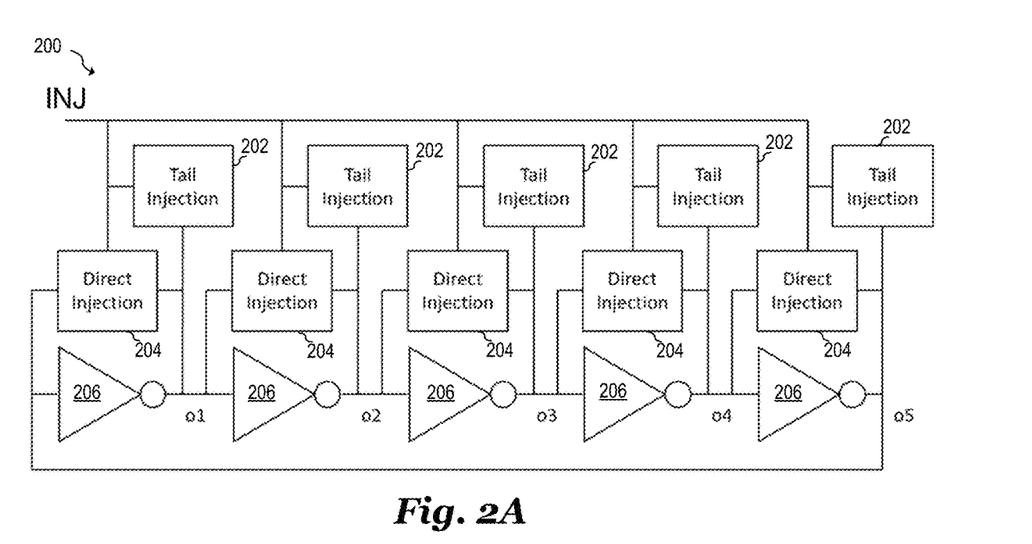
FIG. 2A is a block diagram of an embodiment injection-locked frequency divider (ILFD)

FIG. 2A illustrates ILFD 200 that may be used to implement prescaler 108 shown in FIG. 1. As shown, ILFD 200 is implemented as a ring oscillator, and includes a plurality of ring oscillator stages 206 coupled in a ring configuration. For example, the output of each ring oscillator stage 206 is coupled to the input of an immediately following ring oscillator stage. In the embodiment of FIG. 2A, five ring oscillator stages are shown. However, in alternative embodiments of the present invention, any odd number of stages may be used. Each ring oscillator stage 206 is coupled to a corresponding direct injection circuit 204 and a tail injection circuit 202. Each corresponding direct injection circuit is connected between an input of its corresponding ring oscillator stage and an output of its corresponding ring oscillator stage. Each tail injection circuit 202 is coupled to the output of its corresponding ring oscillator stage 206.

During operation, a VCO signal, such as the RF oscillator signal provided by VCO 106 shown in FIG. 1, is provided to tail injection circuits 202 and direct injection circuits 204. Each of these injection circuits inject a portion of the RF oscillator signal that is provided at node INJ, which is also referred to an "oscillator input node." As a result, the frequency of ILFD 200 is locked to a sub harmonic of the RF oscillator signal. In the particular case of the embodiment of FIG. 2A, the frequency of operation of ILFD 200 is one-fifth the frequency of the RF oscillator signal. Accordingly, ILFD 200 operates as a divide-by-five prescaler with respect to the RF oscillator signal. For example, if the RF oscillator signal is 30 GHz, ILFD 200 oscillates at a frequency of 6 GHz.

In some embodiments, direct injection circuit 204 and tail injection circuit 202 are configured to have an impedance that varies with respect to the RF oscillator signal. For example, tail injection circuit 202 may be configured to have a low impedance when the RF oscillator signal at node INJ is at a lower voltage, and direct injection circuit 204 may be configured to have a low impedance when the RF oscillator signal at node INJ approaches it peak voltage. One example of such a circuit configuration is shown in FIG. 2B, which illustrates a circuit 220 that implements a ring oscillator stage 206 and its associated direct injection circuit 204 and tail injection circuit 202.

Figure 2B:
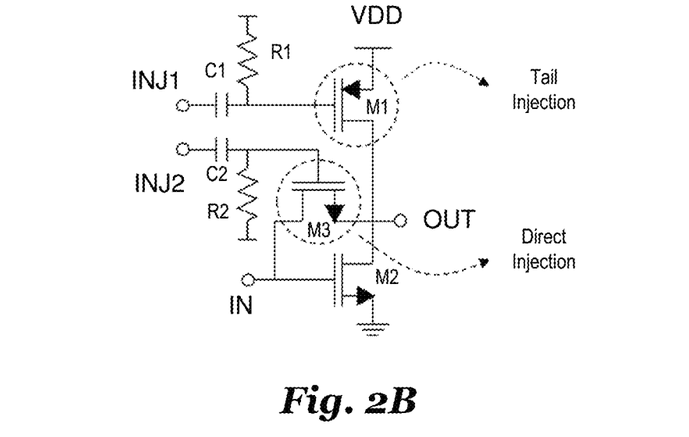
FIG. 2B is a schematic of an circuit implementation of a stage of the ILFD of FIG. 2A.

In the embodiment of FIG. 2B, ring oscillator element 206 is implemented using NMOS transistor M2, tail injection circuit 202 is implemented using PMOS transistor M1, and direct injection circuit 204 is implemented using NMOS transistor M3. The RF oscillator signal is provided at nodes INJ1 and INJ2. As shown, the RF oscillator signal at INJ1 is provided to the gate of PMOS transistor M1 via AC coupling capacitor C1. Similarly, the RF oscillator signal at INJ2 is provided to the gate of NMOS transistor M3 via AC coupling capacitor C2. Resistor R1 is used to provide a DC bias to the gate of PMOS transistor M1, and resistor R2 is used to provide a DC bias to the gate of NMOS transistor M3.

While embodiments of the present invention are described herein using NMOS and PMOS device that could be implemented using a CMOS technology fabricated on a semiconductor substrate, such as a silicon substrate, it should be understood that embodiments of the present invention may be implemented in other technologies using other device types. For example, JFETs and/or bipolar junction transistors BJTs may be used in place of MOS devices. The gates of the NMOS and PMOS transistors described herein may also be referred to a "control node," and the circuit path between the drain and source of the NMOS and PMOS transistors may be referred to a "load path." The terminology of "control node" and "load path" also applies to non-MOS devices. For example, a base of a bipolar junction transistor may also be referred to as a "control node" and a circuit path between the collector and emitter may be referred to as a "load path."

During operation, NMOS transistor M2 (which is also referred to as a "ring oscillator transistor") amplifies the input signal at input node IN, and provides an amplified and inverted signal at output node OUT. This amplified signal is propagated around the ring oscillator. With respect to the tail injection circuit 202 implemented by PMOS transistor M1, as the voltage of the RF oscillator signal at node INJ1 decreases, PMOS transistor M1 begins to turn on and provides a low impedance path between output node OUT and the power supply terminal VDD. On the other hand, as the voltage of the RF oscillator signal at node INJ1 increases, PMOS transistor M1 turns off and provides a higher impedance path between output node out and power supply terminal VDD. Accordingly, the operation of the ring oscillator become such that the timing of peak voltage at node OUT becomes synchronized with the negative peaks of the RF oscillator signal coupled to node INJ1.

With respect to the direct injection circuit 202 implemented by NMOS transistor M3, as the voltage of the RF oscillator signal at node INJ2 increases, NMOS transistor M3 begins to turn on and provides a low impedance path between input node IN and output node OUT. As the voltage of the RF oscillator signal at node INJ2 decreases, NMOS transistor M3 turns off and provides a higher impedance path between input node IN and output node OUT. Accordingly, the operation of the ring oscillator become such that time during the oscillation cycle at which the voltage at node OUT is equal to the voltage at node IN becomes synchronized with a positive peak of the RF oscillator signal coupled to node INJ2.

In some embodiments, both nodes INJ1 and INJ2 are coupled to the output VCO 106 and are configured to have the same phase. In other embodiments, one or more phase shifters may be used to adjust the relative phase of the signals at nodes INJ1 and INJ2. For example, in some embodiments, the RF oscillator signal at node INJ1 may be 180 degrees out of phase with the RF oscillator signal at node INJ2. It should be understood that the circuit level implementation shown in FIG. 2B is just one of many ways of implementing the various components of ILFD 200 shown in FIG. 2A. In alternative embodiments, other circuits could be used. For example, ring oscillator stage 206 may be implemented using PMOS transistor instead of NMOS transistor M2, or may be implemented using other transistor types known in the art; NMOS transistor M3 used to implement direct injection circuit 204, may be implemented using a PMOS transistor or other transistor types; and PMOS transistor M1 used to implement tail injection circuit 202 may be implemented using other transistors. In some embodiments, tail injection circuit 202 may be implemented using an NMOS transistor coupled between node OUT and ground.

Figure 2C:
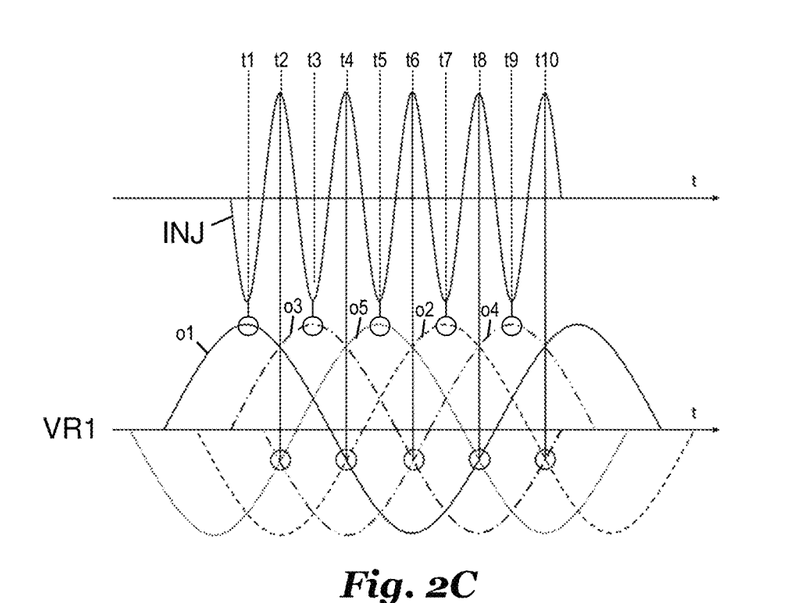
FIG. 2C is a waveform diagram illustrating the operation of the ILFD of FIG. 2A.

FIG. 2C illustrates a waveform diagram that shows the relationship between the RF oscillator signal at node INJ and the various output voltages o1, o2, o3, o4 and o5 of ring oscillator stages 206 for ILFD 200 shown in FIG. 2A when circuit of FIG. 2B is used to implement each stage of the ring oscillator. Due to tail injection circuit 202 providing a lower impedance between a power supply node and ring oscillator outputs o1, o2, o3, o4 and o5 via PMOS transistor M1, each negative peak of the RF oscillator signal at node INJ corresponds to a positive peak of one of ring oscillator output signals at nodes o1, o2, o3, o4 and o5. For example, the negative peaks of the RF oscillator signal at node INJ at times t1, t3, t5, t7 and t9 correspond to positive peaks of the ring oscillator output signals at nodes o1, o3, o5, o2 and o4, respectively.

With respect to direct injection circuits 204 providing a lower impedance between the input and output of each stage 206 of the ring oscillator via NMOS transistor M3, each time that the voltage between the input and output of a ring oscillator stage 206 is about equal corresponds to a positive peak of the RF oscillator signal at node INJ. For example, at time t2, signals o4 and o5 corresponding to the input and output of the fifth oscillator stage 206 are about equal; at time t4, signals o1 and o2 corresponding to the input and output of the first oscillator stage 206 are about equal; at time t6, signals o3 and o4 corresponding to the input and output of the fifth oscillator stage 206 are about equal; at time t8, signals o4 and o5 corresponding to the input and output of the fifth oscillator stage 206 are about equal.

Figure 3A:
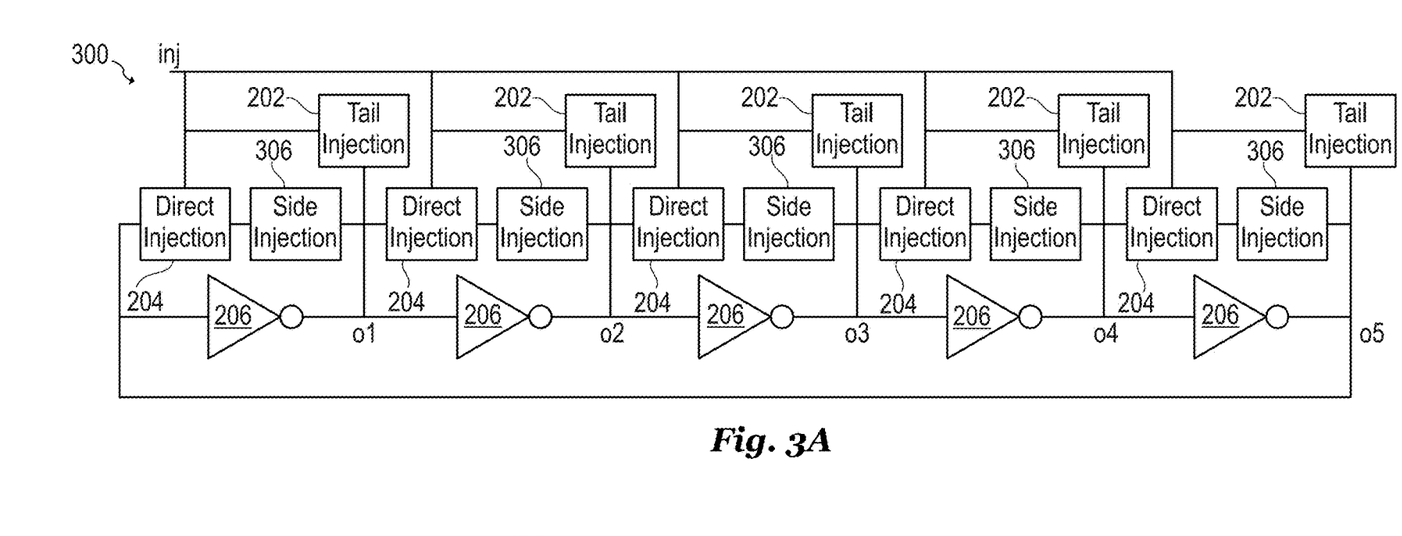
FIG. 3A is block diagram of another embodiment ILFD.

FIG. 3A illustrates ILFD 300 that may also be used to implement prescaler 108 shown in FIG. 1. ILFD is similar to the ILFD 200 shown in FIG. 2A, with the addition of a side injection circuit 306 coupled in series with each direct injection circuit 204. In various embodiments, side injection is implemented by using the lower frequency divided signal within the ring oscillator to modulate the gain of the injected RF oscillator signal. In an embodiment, the impedance of side injection circuit 306 various according to the signal level at the input of its corresponding ring oscillator stage 206. Thus, in ILFD 300, where the direct injection circuit 204 is coupled in series with side injection circuit 306, the effective gain of direct injection circuit 204 is controlled by the input or output voltage of the ring oscillator stage 206 to which the particular direct injection circuit 204 and side injection circuit 306 is connected.

In some embodiments, side injection circuit 306 is configured to effectively increase the gain of direct injection circuit 204 during portions of the waveform cycle where the input and output voltages are likely to cross each other, and decrease the gain of direction injection circuit 204 during portions of its associated ring oscillator cycle were the input and output voltage are less likely to cross each other. Thus, by applying a certain output sequence to side injection circuits 306, gain conversion may be optimized, and the useful injection of the system may be optimized in some embodiments.

It should be understood that the ILFD 300 of FIG. 3A is just one of many possible configurations of an ILFD that utilizes side injection. In alternative embodiments, the relative positions of direction injection circuit 204 and side injection circuit 306 may be reversed. For example, side injection circuit 306 may have its input coupled to the input of ring oscillator element 206, and direct injection circuit 204 may have its input coupled to the output of side injection circuit 306 and its output coupled to the output of its respective ring oscillator element 206. In addition to or in place of side injection circuit 306 coupled in series with direct injection circuit 204, a side injection circuit may also be coupled in series with tail injection circuit 202. It should also be understood that ILFD 300 may have greater or fewer than the five ring oscillator elements 206 depicted in order to implement other division ratios.

Figure 3B:
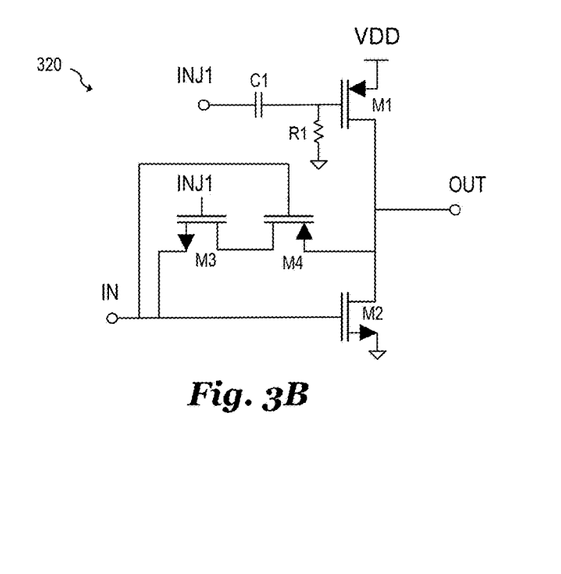
FIGS. 3B and 3C are schematics of circuit implementations of a stage of the ILFD of FIG. 3A.

FIG. 3B illustrates a schematic of a circuit 320, which is an example implementation of direct injection circuit 204, tail injection circuit 202, side injection circuit 306 and ring oscillator element 206 shown in FIG. 3A. As shown, ring oscillator element 206 is implemented using NMOS transistor M2, tail injection circuit 202 is implemented using PMOS transistor M1, direct injection circuit 204 is implemented using NMOS transistor M3, and side injection circuit 306 is implemented using PMOS transistor M4. The RF oscillator signal at INJ1 is provided to the gate of PMOS transistor M1 via AC coupling capacitor C1, and resistor R1 is used to provide a DC bias to the gate of PMOS transistor M1. The gate of PMOS transistor used to implement side injection circuit 306 is coupled to node IN.

Operation of the circuit 320 of FIG. 3B is similar to the operation of the circuit 220 shown in FIG. 2B, with the exception that a series combination of NMOS transistor M3 and PMOS transistor M4 are used to provide a low impedance path between node IN and node OUT when the voltage at node IN is low (thereby turning on PMOS transistor M4) and the voltage at node INJ1 is high (thereby turning on NMOS transistor M3). It should be understood that in alternative embodiments of the present invention, NMOS transistor M3 could be implemented using a PMOS transistor and/or PMOS transistor M4 may be implemented using an NMOS transistor. Moreover, the signals side injection circuits 306 could be different from what is shown in the specific examples of FIGS. 3A and 3B. For example, the gate of transistor M4 may be driven by a different stage from the immediately preceding stage, and/or the signal driving the gate of transistor M4 may be phase shifted.

Figure 3C:
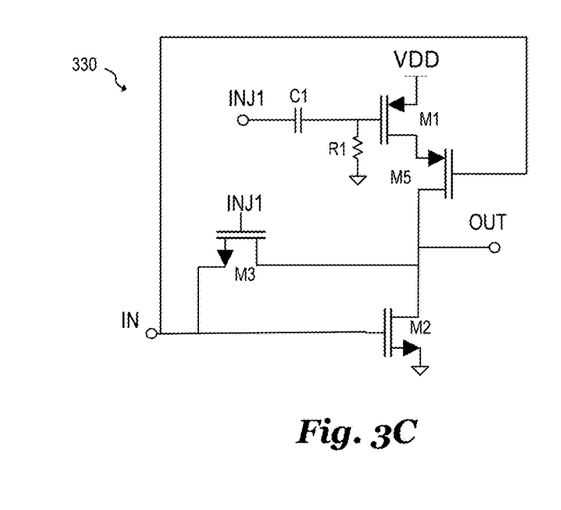

FIG. 3C illustrates a schematic of a circuit 330, which is an example implementation of direct injection circuit 204, side injection circuit 306 and ring oscillator element 206 in which side injection circuit 306 is coupled in series with tail injection circuit 202. As shown, ring oscillator element 206 is implemented using NMOS transistor M2, tail injection circuit 202 is implemented using PMOS transistor M1, direct injection circuit 204 is implemented using NMOS transistor M3, and side injection circuit 306 is implemented using PMOS transistor M5. The RF oscillator signal at INJ1 is provided to the gate of PMOS transistor M1 via AC coupling capacitor C1, and resistor R1 is used to provide a DC bias to the gate of PMOS transistor M1. The gate of PMOS transistor M5 used to implement side injection circuit 306 is coupled to node IN.

Operation of the circuit 320 of FIG. 3B is similar to the operation of the circuit 220 shown in FIG. 2B, with the exception that a series combination of PMOS transistor M1 and PMOS transistor M5 are used to provide a low impedance path between power supply node VDD and node OUT when the voltage at node IN is low (thereby turning on PMOS transistor M5) and the voltage at node INJ1 is high (thereby turning on NMOS transistor M4).

Figure 4A:
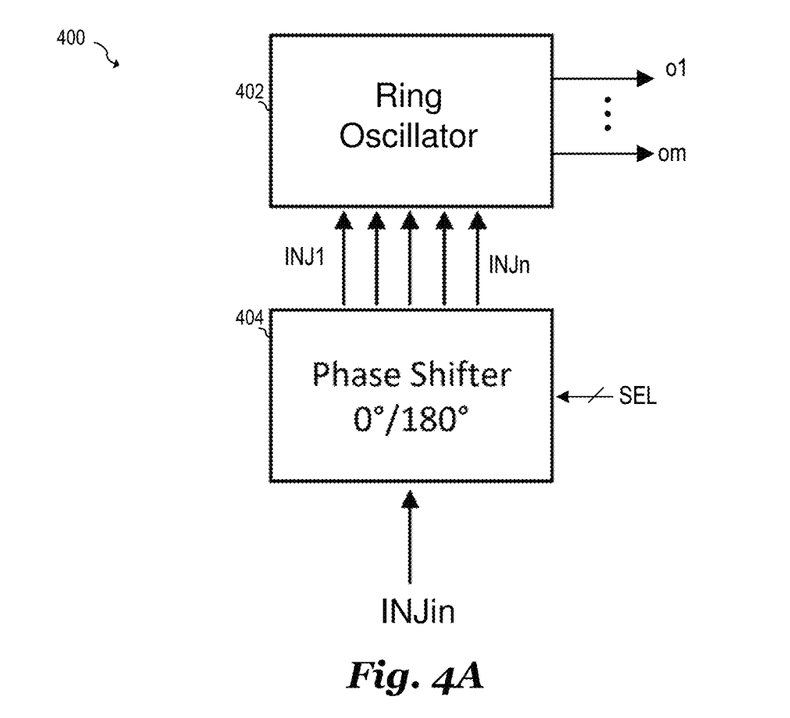
FIG. 4A is a block diagram of a further embodiment ILFD that utilizes a phase shifter.

In some embodiments of the present invention, the injected RF oscillator signal may be phase shifted prior to being injected into the ring oscillator. An example of such a system is shown in FIG. 4A that illustrates ILFD 400 that includes ring oscillator 402 and phase shifter 404. As shown, phase shifter 404 produces n phase shifted injection signals INJ1 to INJn based on an input RF oscillator signal at node INJin. In one embodiment, the phase of INJin is selectively shifted by 0° or by 180° based on selection signal SEL. Thus, each of the n phase shifted signals may have a phase shift of either by 0° or by 180°. In alternative embodiments of the present invention, phase shifter 404 may implement other phase shifts besides 0° or 180°.

Figure 4B:
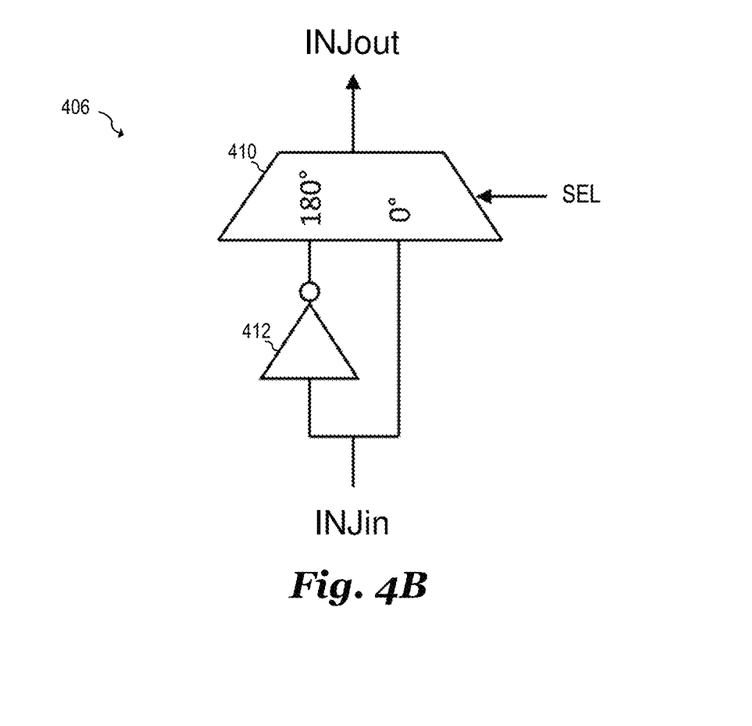
FIG. 4b is a schematic of an embodiment phase shifter.

FIG. 4B illustrates a phase shifter circuit 406 that may be used to phase shift a single phase shifted signal. In some embodiments, phase shifter circuit 406 may be used to implement one phase shifting channel of phase shifter 404 shown in FIG. 4A. In an embodiment, phase shifter circuit 406 includes a multiplexer 410 and an inverter 412. During operation, selection signal SEL causes multiplexer 410 to select either the RF oscillator signal at node INJin, which represents a phase shift of 0°, or an inverted version of the RF oscillator signal produced by inverter 412, which represents a phase shift of 180°. In various embodiments, a total of n phase shifter circuits 406 may be used to implement phase shifter 404 shown in FIG. 4A. It should be appreciated that phase shifter circuit 406 is just one of many example phase shifter circuits that may be used to implement embodiment phase shifting functions.

Figure 5A:
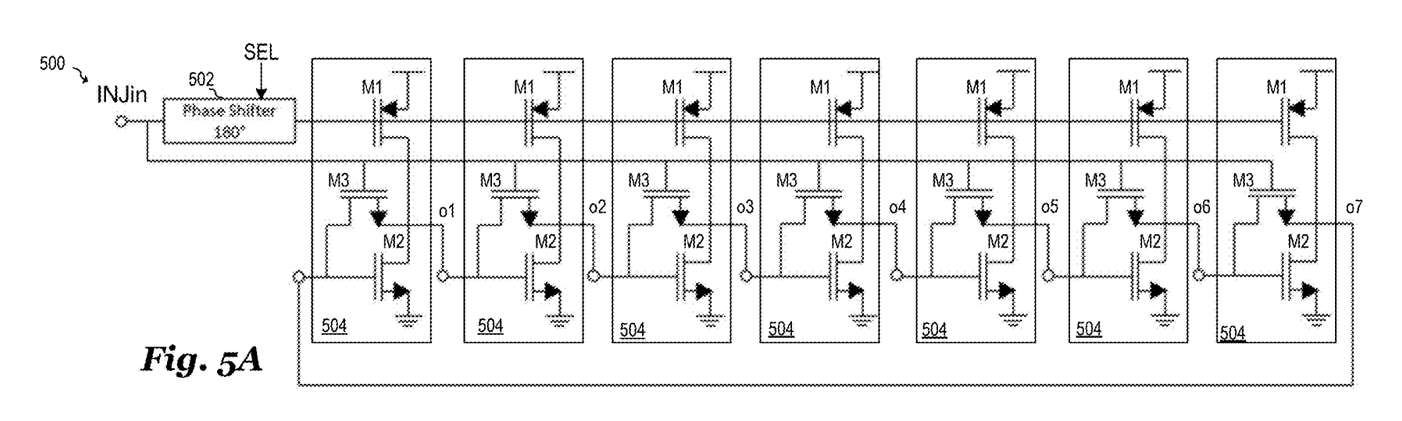
FIG. 5A illustrates a schematic of an ILFD according to a further embodiment.

FIG. 5A illustrates ILFD 50o according to a further embodiment of the present invention, which may be used to implement prescaler 108 shown in FIG. 1. As shown, ILFD 500 includes seven stages 504 coupled in a ring configuration. Each stage 504 includes PMOS transistor M1 that performs the function of tail injection circuit 202, NMOS transistor M3 that performs the function of direct injection circuit 204, and NMOS transistor M2 that implements the function of ring oscillator stage 206 described in embodiments above. In addition to the seven stages 504, phase shifter 502 is included to perform a 180° phase shift of the RF oscillator signal at node INJin. In some embodiments, phase shifter 502 is implemented using phase shifter 406 described above with respect to FIG. 4B. The operation of ILFD 50o is similar to the operation of ILFD 200 shown in FIG. 2A discussed above, with the exception that ILFD 500 functions as a divide-by-seven prescaler due to its seven stages as opposed to the divide-by-five prescaler of ILFD 200 that has five stages. In addition, the relationship between the RF oscillator signal at node INJin and the peak excursions of outputs o1, o2, o3, o4, o5, o6 and o7 is modified due to phase shifter 502 as is shown below with respect to the waveform diagram of FIG. 5B.

Figure 5B:
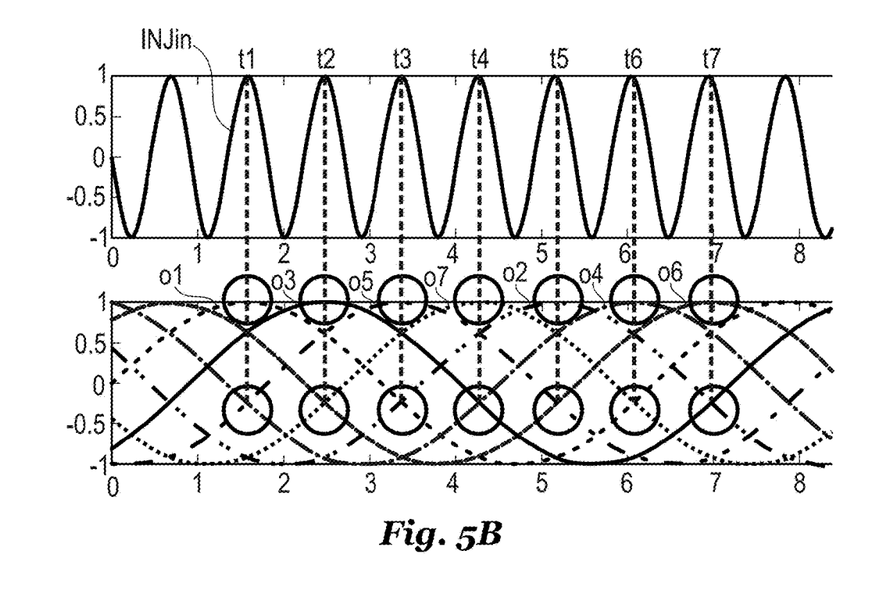
FIG. 5B illustrates a waveform diagram showing the operation of the ILFD of FIG. 5A.

FIG. 5B illustrates a waveform diagram that shows the relationship between the RF oscillator signal at node INJin and the various output voltages o1, o2, o3, o4, o5, o6 and o7 of stages 504 for ILFD 500 shown in FIG. 5A. Due to PMOS transistor M1 providing a lower impedance between the power supply node and ring oscillator outputs o1, o2, o3, o4, o5, o6, each positive peak of the RF oscillator signal at node INJin corresponds to a positive peak of one of ring oscillator output signals o1, o2, o3, o4, o5, o6 and o7. Because phase shifter 502 inverts the phase of the RF oscillator signal prior to driving the gates of PMOS transistor M1, the relationship between the peaks of the RF oscillator signal and the peaks of the output signals is different from the waveform diagram of FIG. 2B in which the positive peaks of the output signals correspond to a negative peak of the RF oscillator signal.

As shown in FIG. 5B, at time t1, when the RF oscillator signal at node INJin is at its peak voltage level, output o1 is at its peak signal level due to PMOS transistor M1 being on, and outputs o4 and o5 have substantially equal voltage levels due to NMOS transistor M3 being turned on. Similarly, at time t2 when INJin is at its peak voltage level, output o3 is at its peak voltage level and outputs o6 and o7 have substantially equal voltage levels; at time t3 output o5 is at its peak voltage level and outputs o1 and 02 have substantially equal voltage levels; at time t4 output o7 is at its peak voltage level and outputs o3 and o4 have substantially equal voltage levels; at time t5 output o2 is at its peak voltage level and outputs o5 and o6 have substantially equal voltage levels; at time t6 output o4 is at its peak voltage level and outputs o7 and o1 have substantially equal voltage levels; and at time t7 output o6 is at its peak voltage level and outputs o2 and o3 have substantially equal voltage levels.

In some embodiments, phase shift circuit 502 may also be configured to selectively provide a 0° degree phase shift via selection signal SEL. Selectively changing the phase may be used to adjust or optimize the performance of IFLD 500, or may be used to adjust the phase of the RF oscillator signal to accommodate a dual modulus pre-scaler. For example, in some embodiments, two of stages 504 may be deactivated (e.g., by routing output signal o5 to the input of the first stage 504 instead of output signal o7) and the phase shift of phase shift circuit 502 configured to have 0° degree phase shift to selectively implement a divide-by-five prescaler. During operation as a divide-by-seven prescaler, all seven stages 504 are activated as depicted and phase shift circuit 502 is configured to have a 180° degree phase shift.

Figure 6A:
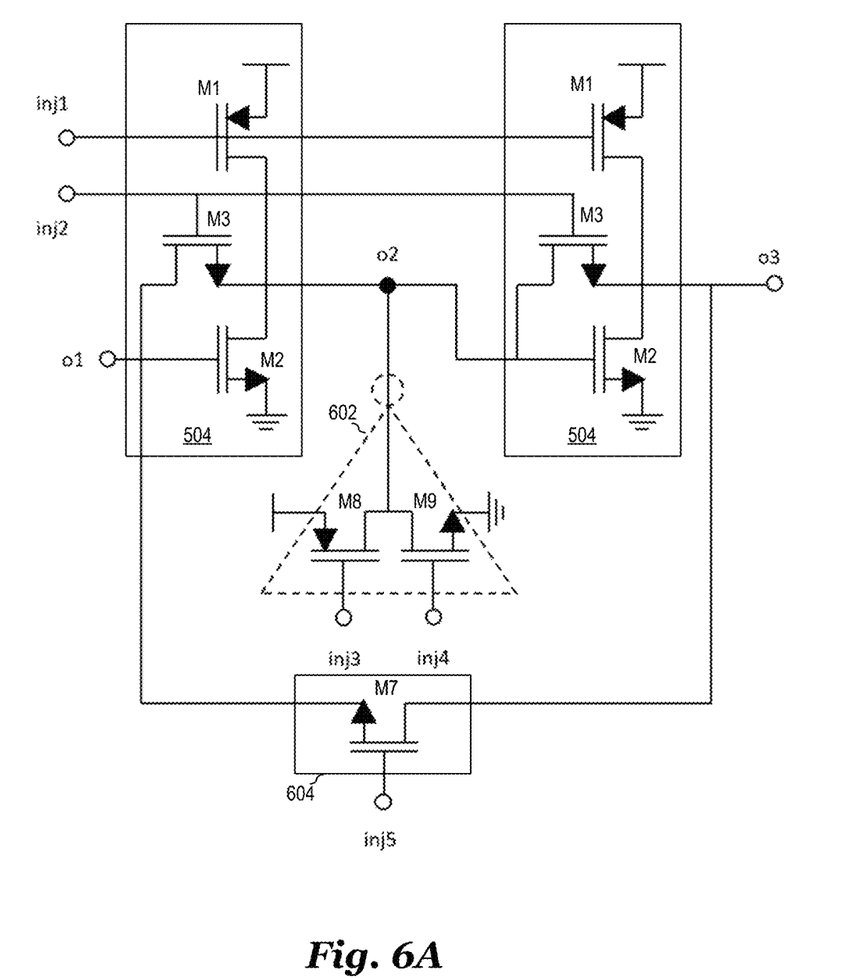
FIGS. 6A and 6B illustrate schematics of an ILFD according to another embodiment.

In addition to the direct injection, side injection and tail injection circuits described above, additional injection paths are possible in embodiments of the present invention as illustrated in FIG. 6, which shows two instances of stage 504 described above interfaced with additional devices.

As discussed above, stage 504 includes PMOS transistor M1 that implements a tail injection circuit, NMOS transistor M2 that implements a ring oscillator stage, and NMOS transistor M3 that implements a direct injection circuit. The gate of transistor M1 is shown coupled to a first injection node INJ1, the gate of transistor M3 is shown coupled to a second injection node INJ2, and the gate of transistor M2 is shown coupled to the output of the previous ring oscillator stage. In addition to these devices, an inverter stage 602 having an output coupled to the node o2 at the output of the first instance of stage 504 is included to provide additional tail injection. Inverter stage 602 includes a PMOS device M8 having a gate connected to a third injection node INJ3, and NMOS device M9 having a gate coupled to a fourth injection node INJ4. Thus, each of PMOS device M8 and NMOS device Mg function as further tail injection circuits. A further direct injection circuit 604 is coupled between node o1 at the input of the first instance of stage 504 and the output of the second instance of stage 504. Further injection circuit 604 includes NMOS transistor M7 having a gate coupled to a fifth injection node INJ5. In some embodiments, one or more of transistors M1, M3, M7, M8 or M9 may be omitted. In yet further embodiments, side injection functionality may also be added by coupling a side injection circuit in series with PMOS transistor M1 or NMOS transistor M1 as described above with respect to FIGS. 3A to 3C. Thus, embodiments of the present invention may include any combination of injection circuits described above. In various embodiments, each injection node INJ1, INJ2, INJ3, INJ4 and INJ5 is configured to provide the RF oscillator signal having a 0° phase shift or a 180° phase shift. These phase shifts may be generated, for example, using the phase shifter circuit described above with respect to FIGS. 4A and 4B.

Figure 6B:
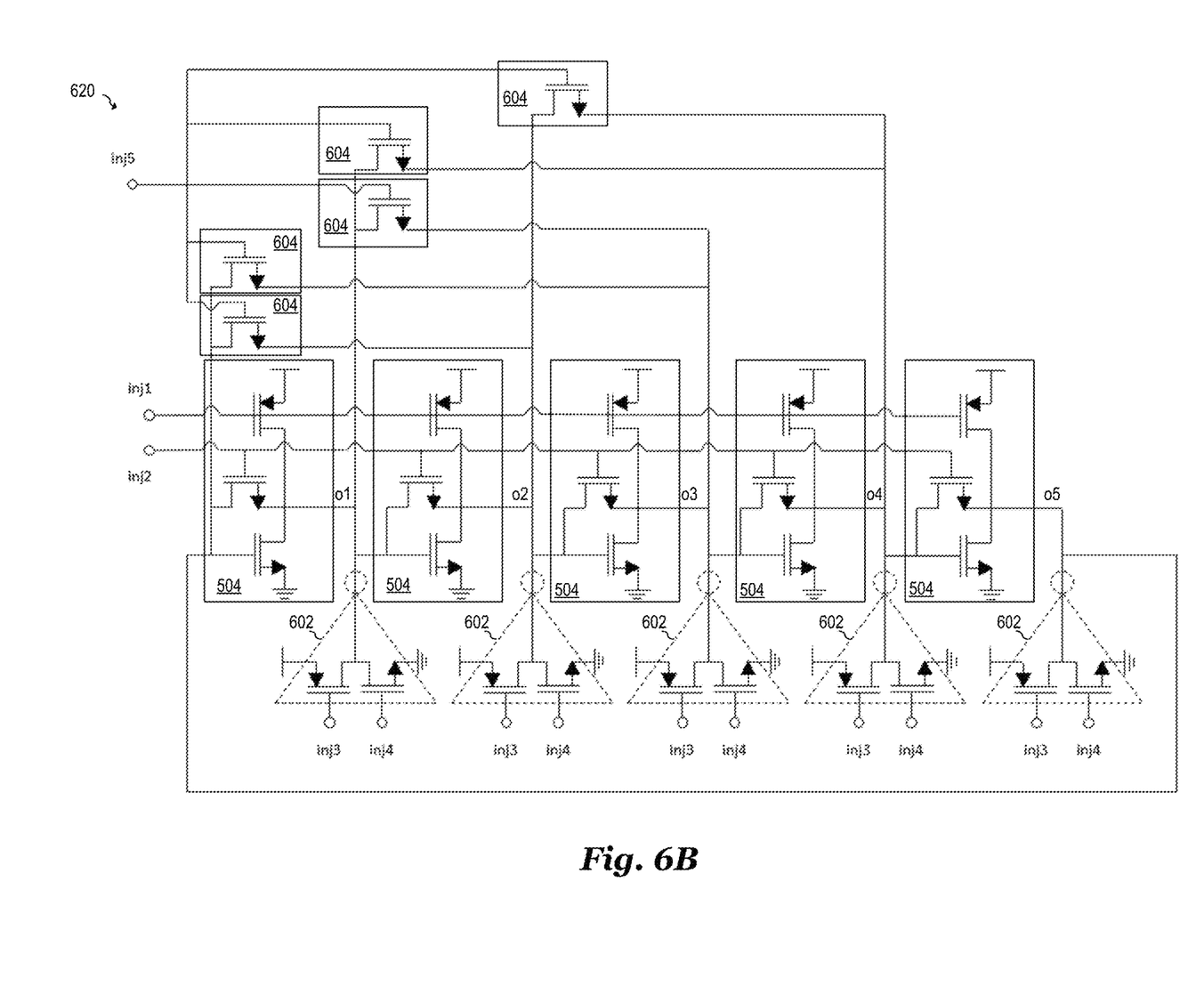

FIG. 6B illustrates ILFD 620 that could also be used to implement prescaler 108 shown in FIG. 1. As shown, ILFD 620 includes five of stages 504, five inverter stages 602 and five further direct injection circuits 604 arranged in a ring configuration. Thus, ILFD functions as a divide-by-five prescaler. Each stage 504 is coupled to a corresponding inverter stage 602 at its output, and each further direct injection circuit 604 is coupled between two adjacent stages 504.

Generally, the locking range of embodiment ILFDs is proportional to the number of injection paths present in the design. However, it should be understood that the parasitic loading increases as the number of injection circuits increases. This increase in parasitic loading can increase the power consumption of the circuit. Thus, there is a tradeoff between the number of injection used in a design and the power consumed by the design.

Figure 7:
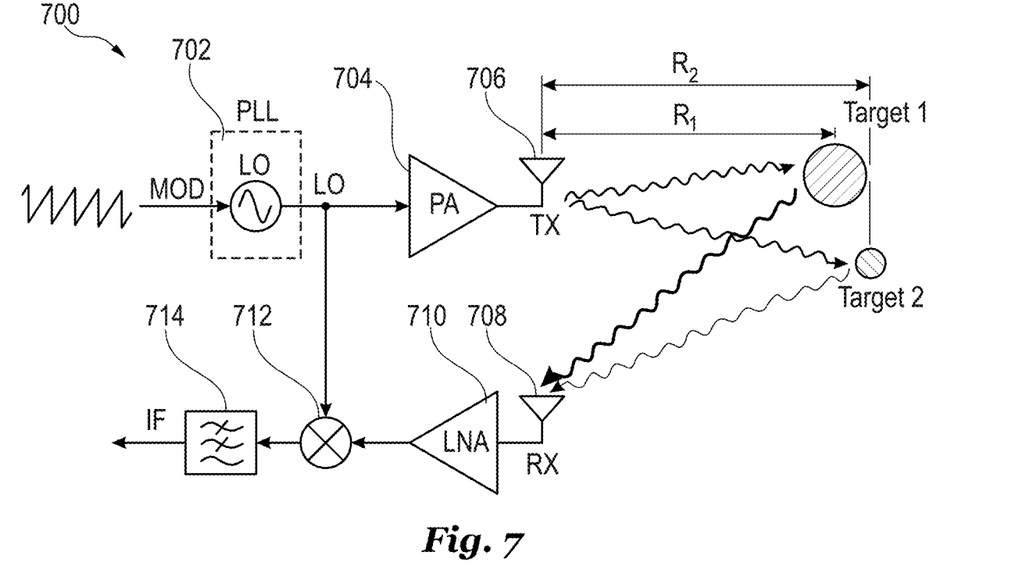
FIG. 7 illustrates a radar system that utilizes an embodiment ILFD.

FIG. 7 illustrates a radar system 700 that utilizes a prescaler according to embodiments of the present invention. As shown, radar system 700 includes PLL 702, power amplifier 704, transmit antenna 706, receive antennas 708, low noise amplifier (LNA) 710, mixer 712, and low-pass filter 714. PLL 702 may be implemented, for example, using to PLL 100 shown in FIG. 1 including embodiment prescaler 108. During operation, the output frequency of 702 is modulated using modulation signal MOD. In some embodiments, modulation signal MOD includes a ramp signal in order to implement a series of frequency chirps to implement a frequency modulated continuous wave (FMCW) radar system. PLL 702 thus produces a local oscillator signal LO having a ramped frequency. Local oscillator signal Lo is then amplified by power amplifier 704, the output of which is transmitted to one or more targets via transmit antenna 706. RF signals that are reflected from the one or more targets are received by receive antenna 708. The received signal is amplified by LNA 710, and the amplified signal is downconverted to an intermediate frequency (IF) using mixer 712 to mix the received signal with local oscillator signal LO. The downconverted signal is then filtered using low-pass filter 714 to form intermediate frequency signal IF. In embodiments that use FMCW radar techniques, the difference in frequencies between the RF signal transmitted at antenna 706 and the reflected signal received at receive antenna 708 is proportional to the distance between the radar system and the one or more targets. It should be understood that the implementation example of FIG. 7 is just one of many possible systems that may use embodiment prescaler circuits described herein.

Figure 8:
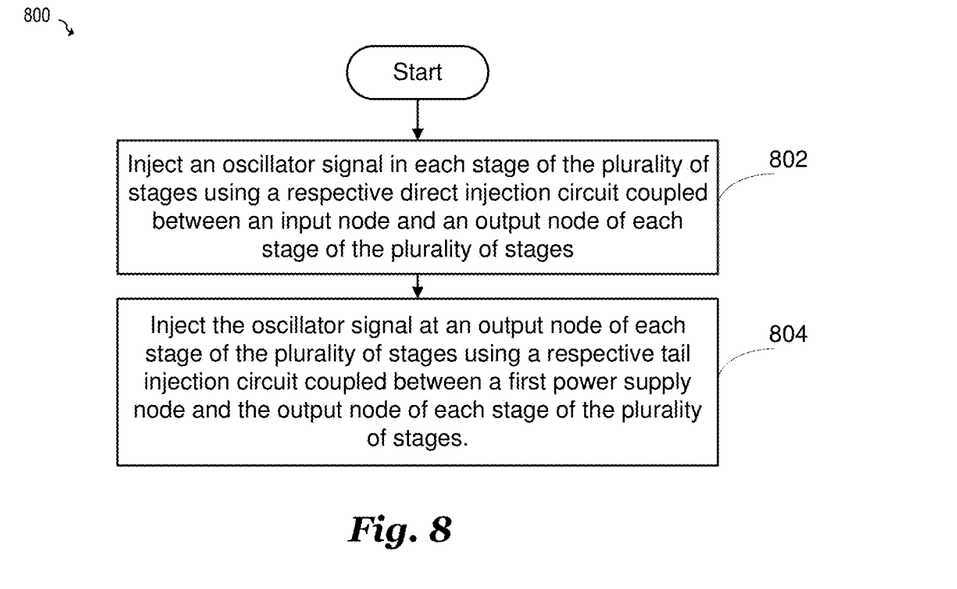
FIG. 8 illustrates a block diagram of an embodiment method.

FIG. 8 illustrates a method 800 of operating an injection locked prescaler according to an embodiment of the present invention. In step 802, an oscillator signal is injected in each stage of a plurality of ring oscillator stages using a respective direct injection circuit coupled between an input nodes and an output node of each stage of the plurality of ring oscillator stages. In some embodiments, ring oscillator stage 206 and direct injection circuit 204 described in embodiments herein may be used to implement each stage of the plurality of ring oscillator stages and the direct injection circuit.

In step 804, the oscillator signal is injected in each stage of the plurality of ring oscillator stages using a respective tail injection circuit coupled between a first power supply node and an output node of the each stage of the plurality of ring oscillator stages. In some embodiments, tail injection circuit 202 may be used to implement the tail injection circuit.

Embodiments of the present invention are summarized here. Other embodiments can also be understood from the entirety of the specification and the claims filed herein.

Example 1

A circuit, including: a ring oscillator including a plurality of stages coupled in a ring configuration, each stage of the plurality of stages including an input node coupled to an output node of a previous stage of the plurality of stages, where each stage of the plurality of stages includes: a ring oscillator transistor having a control node coupled to the input node, and a load path coupled to the output node, a direct injection circuit having a load path coupled between the control node of the ring oscillator transistor and the output node, and a control node coupled to a first oscillator input node, and a tail injection circuit having a load path coupled between the output node and a first power supply node and a control node coupled to a second oscillator input node.

Example 2

The circuit of example 1, further including a phase shifter circuit having a first output coupled to the first oscillator input node, and a second output coupled to the second oscillator input node, where the phase shifter is configured to provide a first oscillator signal having a first phase at the first output, and a second oscillator signal at the second output, where the first oscillator signal and the second oscillator signal are 180 degrees out of phase with each other.

Example 3

The circuit of one of examples 1 or 2, where the ring oscillator transistor, the direct injection circuit, and the tail injection circuit each includes a MOS transistor.

Example 4

The circuit of one of examples 1 to 3, where the plurality of stages consists of an odd number of stages.

Example 5

The circuit of one of examples 1 to 4, where each stage of the plurality of stages further includes a side injection circuit having a load path coupled in series with the load path of the direct injection circuit.

Example 6

The circuit of one of examples 1 to 5, where each stage of the plurality of stages further includes a side injection circuit having a load path coupled in series with the load path of the tail injection circuit.

Example 7

The circuit of one of examples 1 to 6, where the ring oscillator further includes a further direct injection circuit having a load path coupled between an input node of a first stage of the plurality of stages, and an output node of a second stage of the plurality of stages.

Example 8

The circuit of one of examples 1 to 7, where each stage of the plurality of stages further includes a further tail injection circuit having a load path coupled between the output node and a second power supply node, and a control node coupled to the oscillator input node.

Example 9

A method of operating a circuit including an injection locked frequency divider (ILFD) having a plurality of stages coupled in a ring configuration, the method including: injecting an oscillator signal in each stage of the plurality of stages using a respective direct injection circuit coupled between an input node and an output node of each stage of the plurality of stages; and injecting the oscillator signal at an output node of each stage of the plurality of stages using a respective tail injection circuit coupled between a first power supply node and the output node of each stage of the plurality of stages.

Example 10

The method of example 9, further including injecting an input signal of each stage of the plurality of stages using a respective side injection circuit coupled in series with each respective direct injection circuit.

Example 11

The method of one of examples 9 or 10, where injecting the oscillator signal at an output node of each stage further includes using a respective further tail injection circuit coupled between a second power supply node and the output node of each stage of the plurality of stages.

Example 12

The method of one of examples 9 to 11, further including injecting the oscillator signal between an input of a first stage of the plurality of stages and an output of a second stage of the plurality of stages using a further direct injection circuit coupled between the input of the first stage of the plurality of stages and the output of the second stage of the plurality of stages.

Example 13

The method of one of examples 9 to 12, further including: generating the oscillator signal using a voltage controlled oscillator, dividing a frequency of an output of the ILFD using a divider circuit to form a divided signal; comparing a phase of the divided signal with a phase of a reference clock using a phase detector to form a phase detection signal; filtering the phase detection signal using a loop filter to form a VCO control signal; and controlling a frequency of the voltage controlled oscillator using the VCO control signal.

Example 14

The method of one of examples 9 to 13, where the ILFD is configured to divide a frequency of the oscillator signal by a predetermined number.

Example 15

The method of example 14, where the predetermined number is an odd number.

Example 16

A phase locked loop including: an injection locked prescaler including a ring oscillator, where each respective stage of the ring oscillator includes a respective direct injection circuit coupled between an input and output of each respective stage, and a tail injection circuit coupled between the output of each respective stage and a power supply node; a phase detector having an input coupled to an output of at least one stage of the ring oscillator; and a voltage controlled oscillator having a oscillator signal output coupled to each respective direct injection circuit and each respective tail injection circuit, and a frequency control input coupled to an output of the phase detector.

Example 17

The phase locked loop of example 16, further including: a divider coupled between the output of the at least one stage of the ring oscillator and the input of the phase detector; and a loop filter coupled between the output of the phase detector and the frequency control input of the voltage controlled oscillator.

Example 18

The phase locked loop of one of examples 16 or 17, where each respective stage of the ring oscillator further includes a respective side injection circuit coupled in series with each respective direct injection circuit.

Example 19

The phase locked loop of one of examples 16 to 18, where: the injection locked prescaler has a locking range of at least 30%; and the injection locked prescaler has a power consumption of less than 10 mW.

Example 20

The phase locked loop of one of examples 16 to 19, where the injection locked prescaler, the phase detector, and the voltage controlled oscillator are disposed on a single semiconductor substrate.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit, comprising:
a ring oscillator comprising a plurality of stages coupled in a ring configuration, each stage of the plurality of stages comprising an input node coupled to an output node of a previous stage of the plurality of stages, wherein each stage of the plurality of stages comprises:
a ring oscillator transistor having a control node coupled to the input node, and a load path coupled to the output node,
a direct injection circuit having a load path coupled between the control node of the ring oscillator transistor and the output node, and a control node coupled to a first oscillator input node configured to receive a first oscillating signal, and
a tail injection circuit having a load path coupled between the output node and a first power supply node, and a control node coupled to a second oscillator input node configured to receive a second oscillating signal.

2. The circuit of claim 1, further comprising a phase shifter circuit having a first output coupled to the first oscillator input node, and a second output coupled to the second oscillator input node, wherein the phase shifter circuit is configured to provide the first oscillating signal having a first phase at the first output, and the second oscillating signal at the second output, wherein the first oscillator signal and the second oscillator signal are 180 degrees output of phase with each other.

3. The circuit of claim 1, wherein the ring oscillator transistor, the direct injection circuit, and the tail injection circuit each comprises a MOS transistor.

4. The circuit of claim 1, wherein the plurality of stages consists of an odd number of stages.

5. The circuit of claim 1, wherein each stage of the plurality of stages further comprises a side injection circuit having a load path coupled in series with the load path of the direct injection circuit.

6. The circuit of claim 1, wherein each stage of the plurality of stages further comprises a side injection circuit having a load path coupled in series with the load path of the tail injection circuit.

7. The circuit of claim 1, wherein the ring oscillator further comprises a further direct injection circuit having a load path coupled between an input node of a first stage of the plurality of stages, and an output node of a second stage of the plurality of stages.

8. The circuit of claim 1, wherein each stage of the plurality of stages further comprises a further tail injection circuit having a load path coupled between the output node and a second power supply node, and a control node coupled to the first oscillator input node or the second oscillator input node.

9. A method of operating a circuit comprising an injection locked frequency divider (ILFD) having a plurality of stages coupled in a ring configuration, the method comprising:
injecting an oscillator signal in each stage of the plurality of stages through a respective direct injection circuit coupled between an input node and an output node of each stage of the plurality of stages; and
injecting the oscillator signal at the output node of each stage of the plurality of stages through a respective tail injection circuit coupled between a first power supply node and the output node of each stage of the plurality of stages.

10. The method of claim 9, further comprising injecting an input signal of each stage of the plurality of stages using a respective side injection circuit coupled in series with each respective direct injection circuit.

11. The method of claim 9, wherein injecting the oscillator signal at the output node of each stage further comprises using a respective further tail injection circuit coupled between a second power supply node and the output node of each stage of the plurality of stages.

12. The method of claim 9, further comprising injecting the oscillator signal between an input of a first stage of the plurality of stages and an output of a second stage of the plurality of stages using a further direct injection circuit coupled between the input of the first stage of the plurality of stages and the output of the second stage of the plurality of stages.

13. The method of claim 9, further comprising:
generating the oscillator signal using a voltage controlled oscillator;
dividing a frequency of an output of the ILFD using a divider circuit to form a divided signal;
comparing a phase of the divided signal with a phase of a reference clock using a phase detector to form a phase detection signal;
filtering the phase detection signal using a loop filter to form a VCO control signal; and
controlling a frequency of the voltage controlled oscillator using the VCO control signal.

14. The method of claim 9, wherein the ILFD is configured to divide a frequency of the oscillator signal by a predetermined number.

15. The method of claim 14, wherein the predetermined number is an odd number.

16. A phase locked loop comprising:
an injection locked prescaler comprising a ring oscillator, wherein each respective stage of the ring oscillator comprises a respective direct injection circuit coupled between an input and output of each respective stage, and a tail injection circuit coupled between the output of each respective stage and a power supply node;
a phase detector having an input coupled to an output of at least one stage of the ring oscillator; and
a voltage controlled oscillator having an oscillating signal output operatively coupled to each respective direct injection circuit and operatively coupled to each respective tail injection circuit, and a frequency control input coupled to an output of the phase detector.

17. The phase locked loop of claim 16, further comprising:
a divider coupled between the output of the at least one stage of the ring oscillator and the input of the phase detector; and
a loop filter coupled between the output of the phase detector and the frequency control input of the voltage controlled oscillator.

18. The phase locked loop of claim 16, wherein each respective stage of the ring oscillator further comprises a respective side injection circuit coupled in series with each respective direct injection circuit.

19. The phase locked loop of claim 16, wherein:
the injection locked prescaler has a locking range of at least 30%; and
the injection locked prescaler has a power consumption of less than 10 mW.

20. The phase locked loop of claim 16, wherein the injection locked prescaler, the phase detector, and the voltage controlled oscillator are disposed on a single semiconductor substrate.

* * * * *